(12) United States Patent
Shinohara

(10) Patent No.: US 7,031,500 B1
(45) Date of Patent: Apr. 18, 2006

(54) SEMICONDUCTOR APPARATUS FOR FINGERPRINT RECOGNITION

(75) Inventor: Mamoru Shinohara, Tokyo (JP)

(73) Assignee: Sony Corporation, Tokyo (JP)

( * ) Notice: Subject to any disclaimer, the term of this patent is extended or adjusted under 35 U.S.C. 154(b) by 634 days.

(21) Appl. No.: 09/711,595

(22) Filed: Nov. 13, 2000

(30) Foreign Application Priority Data

Nov. 12, 1999  (JP) ................................. P11-323051

(51) Int. Cl.
*G06K 9/00* (2006.01)

(52) U.S. Cl. ..................................... 382/124
(58) Field of Classification Search ................ 382/115, 382/124; 283/68; 356/71; 235/380, 492; 340/5.52–5.53; 902/3, 4, 25; 438/597; 257/414
See application file for complete search history.

(56) References Cited

U.S. PATENT DOCUMENTS

| 5,325,442 | A | | 6/1994 | Knapp | |
| 6,248,655 | B1 | * | 6/2001 | Machida et al. | 438/597 |
| 6,326,227 | B1 | * | 12/2001 | Thomas et al. | 438/48 |
| 6,501,142 | B1 | * | 12/2002 | Thomas et al. | 257/414 |

FOREIGN PATENT DOCUMENTS

EP    0 902 387 A2    3/1999

OTHER PUBLICATIONS

Inglis D. et al: "SA 17.7:A Robust, 1.8V 250MUW Direct-Contact 500DPI Fingerprint Sensor" IEEE Inc. New york, US, 1998, pp. 284-285, XP000856844.

* cited by examiner

*Primary Examiner*—Samir Ahmed
(74) *Attorney, Agent, or Firm*—Robert J. Depke; Trexler, Bushnell, Giangiorgi, Blackstone & Marr

(57) ABSTRACT

A semiconductor apparatus, which comprises: a substrate having a transistor; a first electrode formed on the substrate and connected to the transistor; a second electrode formed on the substrate and electrically separated from the first electrode; and an insulating film formed on the substrate so as to cover the first electrode, wherein, when a plane of the insulating film which is not on a side of the substrate is taken as a first plane, a surface facing the first plane of the first electrode is taken as a first surface, and a surface facing the first plane of the second electrode is taken as a second surface, a distance between a surface of the substrate and the second surface is larger than a distance between the surface of the substrate and the first surface. By virtue of having the above unique structure, the semiconductor apparatus of the present invention is advantageous in that, when a finger or any other material which is electrostatically charged is brought closer to the substrate, the static electricity is not discharged into the electrode but into the static-electricity drawing wiring and then drawn out of the semiconductor device, so that the semiconductor devices, the circuits and the like which are connected to the electrode can be prevented from suffering a damage due to the static electricity and from losing the functions thereof.

1 Claim, 3 Drawing Sheets

SEMICONDUCTOR APPARATUS FOR FINGERPRINT RECOGNITION

RELATED APPLICATION DATA

The present application claims priority to Japanese Application No. P11-323051 filed Nov. 12, 1999, which application is incorporated herein by reference to the extent permitted by law.

BACKGROUND OF THE INVENTION

1. Field of the Invention

The present invention relates to a semiconductor apparatus. More particularly, the present invention is concerned with a semiconductor apparatus for fingerprint recognition used as a capacitive mode fingerprint sensor.

2. Description of the Related Art

In recent years, the fingerprint matching system, which has conventionally been utilized in the applications of the administration of entrance and exit and the like, is being attracting attention as a security system for the computer network and a personal identification tool in a portable terminal or the like. Examples of fingerprint detecting methods using the fingerprint matching system include an optical detection method, and a capacitive sensing method disclosed in Japanese Patent Application Laid-Open Specification No. 4-231803, whose basic application is GB9011163 which is also a basic application of U.S. Pat. No. 5,325,442.

The capacitive sensing method is one in which an electrostatic capacity value between the electrodes in the fingerprint sensor is detected, and has an advantage in that the apparatus employing the capacitive sensing method is easily down-sized, and therefore, this method is advantageously mounted on a portable terminal and the like. Thus, the development of the capacitive mode fingerprint sensor is energetically progressed.

FIG. 4 is a diagrammatic cross-sectional view of a semiconductor device for fingerprint recognition, which constitutes the above-mentioned capacitive mode fingerprint sensor.

On a substrate having formed thereon a semiconductor device constituting the sensor, such as a transistor or the like (see FIG. 5A described blow), a barrier metal comprised of titanium (Ti) or the like is formed. On the barrier metal, electrodes 52 comprised of, for example, aluminum or the like are formed so that they are arranged in a matrix form and connected to the above-mentioned semiconductor device. Further, pad electrodes 52a are formed simultaneously with conducting the step of forming the electrodes 52.

An insulating protecting film 53 is formed so as to cover both of the electrodes 52 and the pad electrodes 52a, and an opening portion is formed in each of the pad electrodes 52a. Thus, a fingerprint recognition semiconductor chip 51 using, as a fingerprint-recognizing surface, a region in which the electrodes 52 are arranged in a matrix form is formed.

The pad electrodes 52a formed in the fingerprint recognition semiconductor chip 51 and the lead 55 are connected to each other by a wire bonding 54.

While exposing the fingerprint-recognizing surface (upper surface) of the fingerprint recognition semiconductor chip 51 to the outside, the wire bonding 54 which connects the fingerprint recognition semiconductor chip 51 and the lead 55 is encapsulated by a mold resin 56 comprised of, for example, a thermosetting resin or the like.

Next, an explanation is made on the principle of the operation of the semiconductor device for fingerprint recognition.

FIG. 5A is an enlarged, cross-sectional view of the portion of the electrodes (corresponding to reference numeral 52 in FIG. 4) which are formed in the semiconductor chip (corresponding to reference numeral 51 in FIG. 4) of the semiconductor device for fingerprint recognition so that they are arranged in a matrix form.

On a substrate 10 having formed thereon a semiconductor device constituting the sensor, such as a transistor (not shown) or the like, a barrier metal 20 comprised of Ti or the like is formed. On the barrier metal 20, charge storage electrodes 21 comprised of, for example, aluminum or the like are formed so that they are arranged in a matrix form and connected to the above-mentioned (not shown) semiconductor device on the substrate. An insulating protecting film 30 is formed so as to cover the charge storage electrodes 21.

As shown in FIG. 5A, when a finger 7 is in contact with the fingerprint-recognizing surface of the semiconductor apparatus for fingerprint recognition, a capacitor is formed between the charge storage electrodes 21, the insulating protecting film 30 and the finger 7. The insulating protecting film 30 functions as a part of the capacitor insulating film. In the construction mentioned above, the distance d (for example, $d_1$, $d_2$) between the charge storage electrodes 21 and the finger 7 varies depending on fingerprint unevenness 70. Accordingly, a difference in capacity is caused between the capacitors which constitute the fingerprint sensor and which are formed to be arranged in a matrix form, and thus, the charge stored in each of the charge storage electrodes 21 is read and detected by the semiconductor device formed on the substrate 10, such as a transistor or the like, making it possible to recognize a fingerprint.

In the above semiconductor apparatus, each of the charge storage electrodes 21 constitutes a unit cell of the fingerprint-recognizing surface of the semiconductor apparatus for fingerprint recognition.

In a state such that the finger is not in contact with the fingerprint-recognizing surface, the capacitors constituted by the charge storage electrodes 21 and the like have a "d" value which is infinite ($\infty$) in all of the unit cells of the fingerprint-recognizing surface of the semiconductor apparatus for fingerprint recognition. Therefore, in all of the unit cells, the electrostatic capacity value Cs is zero (0).

On the other hand, in a state such that the finger is in contact with the fingerprint-recognizing surface, as shown in FIG. 5B, in the n-th unit cell, a capacitor having an electrostatic capacity value $C_{sn}$ is formed between the charge storage electrodes 21, the insulating protecting film 30 and the finger 7. The electrostatic capacity value $C_{sn}$ is represented by the formula: $C_{sn} = \epsilon \cdot \epsilon_0 \cdot S / d_n$. In this formula, S is an area contributing to the capacitor of each electrode, $d_n$ is a distance (for example, $d_1$, $d_2$) between the electrode of the n-th unit cell and the finger, and n is the number (n=1, 2, ...) of the unit cell.

In the construction for reading the electrostatic capacity value $C_{sn}$ in each of the unit cells, the capacitor formed between the charge storage electrode 21 of each unit cell, the insulating protecting film 30 and the finger 7 is connected to one source-drain region of the transistor which is gate-controlled by, for example, a word line WL ($WL_1$, $WL_2$, ...), and another source-drain region is connected to a bit line BL ($BL_1$, $BL_2$, ...), and further, a capacitor having an electrostatic capacity value CB is connected to the bit line BL.

In the above construction, when a finger is in contact with the recognition surface in a state such that a potential $V_{cc}$ is applied to the bit line BL ($V_{cc}$ precharge), a potential change represented by the formula: $\Delta Vn=[C_{sn}/(CB+C_{sn})] V_{cc}$ is caused in the bit line BL. The potential change $\Delta V_n$ is detected in each of the unit cells, and the electrostatic capacity value $C_{sn}$ per unit cell is calculated, so that the fingerprint recognition is conducted by image processing or the like.

However, the conventional semiconductor device for fingerprint recognition mentioned above poses a problem in that, when a finger is in contact with the fingerprint-recognizing surface, the static electricity charged in the human body is discharged in the electrodes 52 (21) and a large amount of a current flows through the electrodes 52 (21) into the detecting circuit formed on the same semiconductor substrate (see FIG. 5B), so that the circuit is damaged and the function as the semiconductor apparatus for fingerprint recognition is lost.

On the other hand, as mentioned above, the insulating protecting film 53 (30) for the surface of the semiconductor apparatus for fingerprint recognition functions as a part of the capacitor insulating film of the capacitor formed between the electrodes 52 (21), the insulating protecting film 53 (30) and the finger 7. Therefore, a range within which the thickness of the insulating protecting film 53 (30) is increased and the material for the insulating protecting film 53 (30) is changed for the purpose of suppressing the damage of the circuit due to the discharge of static electricity is inevitably limited.

SUMMARY OF THE INVENTION

In this situation, the present inventor has made extensive and intensive studies with a view toward solving the above-mentioned problems accompanying the prior art. As a result, it has unexpectedly been found that the semiconductor apparatus comprising: a substrate having a transistor; a first electrode formed on the substrate and connected to the transistor; a second electrode formed on the substrate and electrically separated from the first electrode; and an insulating film formed on the substrate so as to cover the first electrode, wherein, when a plane of the insulating film which is not on a side of the substrate is taken as a first plane, a surface facing the first plane of the first electrode is taken as a first surface, and a surface facing the first plane of the second electrode is taken as a second surface, a distance between a surface of the substrate and the second surface is larger than a distance between the surface of the substrate and the first surface is free from the above-mentioned problems accompanying the prior art semiconductor apparatus. Specifically, by virtue of having the above unique structure, the semiconductor apparatus of the present invention is advantageous in that, when a finger or any other material which is electrostatically charged is brought closer to the substrate, the static electricity is not discharged into the electrode but into the static-electricity drawing wiring and then drawn out of the semiconductor apparatus, so that the semiconductor devices, the circuits and the like which are connected to the electrode can be prevented from suffering a damage due to the static electricity and from losing the functions thereof. The present invention has been completed, based on the above novel finding.

Accordingly, it is an object of the present invention to provide a semiconductor apparatus which is advantageous in that, when a finger or any other material which is electrostatically charged is brought closer to the substrate, the semiconductor devices, the circuits and the like which are connected to the electrode can be prevented from suffering a damage due to the static electricity and from losing the functions thereof.

It is another object of the present invention to provide a semiconductor apparatus for fingerprint recognition which is advantageous in that, when a finger which is electrostatically charged is brought closer to the fingerprint-recognizing surface, the semiconductor devices, the circuits and the like which are connected to the electrode can be prevented from suffering a damage due to the static electricity and from losing the functions thereof.

BRIEF DESCRIPTION OF THE DRAWINGS

The foregoing and other objects, features and advantages of the present invention will be apparent to those skilled in the art from the following description of the presently preferred exemplary embodiments of the invention taken in connection with the accompanying drawings, in which.

DETAILED DESCRIPTION OF THE PREFERRED EMBODIMENTS

Hereinbelow, preferred embodiments of the semiconductor apparatus for fingerprint recognition of the present invention will be described in detail with reference to the drawings, but the embodiments should not be construed as limiting the scope of the present invention.

Figure 1:
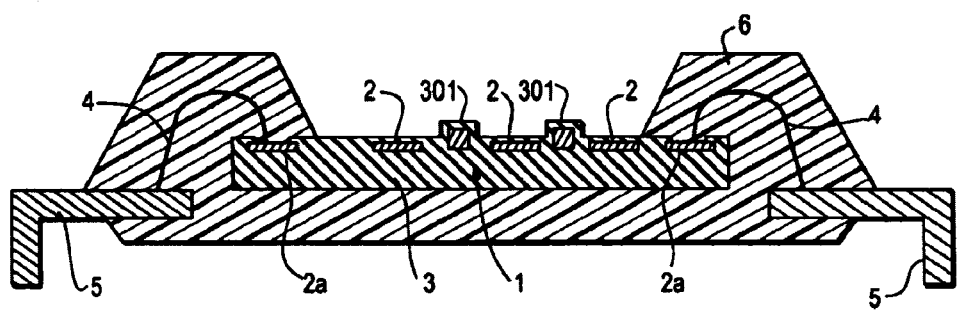
FIG. 1 is a diagrammatic cross-sectional view of a semiconductor apparatus for fingerprint recognition according to the first embodiment of the present invention.
Figure 5A:
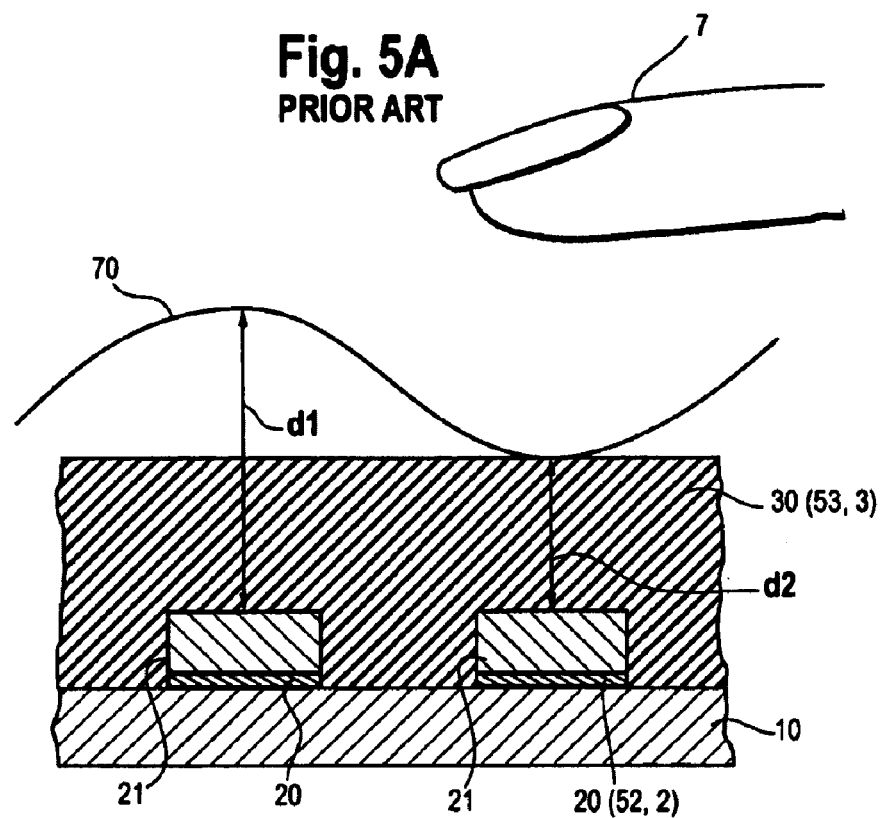
FIGS. 5A and 5B are explanatory views of the principle of the operation of the fingerprint recognition.

In the preferred embodiment, on a substrate 10 having formed thereon a semiconductor device constituting a sensor, such as a transistor or the like, a barrier metal 20 comprised of Ti or a stacked film, such as a Ti/TiN/Ti film, is formed, as shown in FIG. 5A Further, as shown in FIG. 1, electrodes 2 comprised of, for example, aluminum or an aluminum alloy, such as aluminum silicide, are formed on the barrier metal 20 so that they are arranged in a matrix form and connected to the above-mentioned semiconductor device (not shown). Further, pad electrodes 2a are formed simultaneously with conducting the step of forming the electrodes 2.

An insulating protecting film 3, such as a passivation film, is formed so as to cover both of the electrodes 2 and the pad electrodes 2a, and an opening portion is formed in the upper surface of each of the pad electrodes 2a. Thus, a fingerprint recognition semiconductor chip 1 using, as a fingerprint-recognizing surface, a region in which the electrodes 2 are arranged in a matrix form is formed.

The pad electrodes 2a formed in the fingerprint recognition semiconductor chip 1 and the lead 5 are connected to each other by a wire bonding 4.

While exposing the fingerprint-recognizing surface (upper surface) of the fingerprint recognition semiconductor chip 1 to the outside, the wire bonding 4 which connects the fingerprint recognition semiconductor chip 1 and the lead 5 is encapsulated by a mold resin 6 comprised of, for example, a thermosetting resin or the like.

Next, an explanation is made on the operation of the above-mentioned semiconductor device for fingerprint recognition.

The principle of the operation of fingerprint recognition of the present invention is substantially the same as that of the prior art technique, and is explained with reference to FIGS. 5A and 5B.

FIG. 5A is an enlarged, cross-sectional view of the portion of the charge storage electrodes 21 (corresponding to numeral 2 in FIG. 1) in a matrix form of the semiconductor device for fingerprint recognition.

On a substrate 10 having formed thereon a semiconductor device constituting a sensor, such as a transistor (not shown) or the like, a barrier metal 20 comprised of Ti or the like is formed. On the barrier metal 20, charge storage electrodes 21 comprised of, for example, aluminum or the like are formed so that they are arranged in a matrix form and connected to the above-mentioned (not shown) semiconductor device on the substrate. An insulating protecting film 30, such as a passivation film, is formed so as to cover the charge storage electrodes 21.

As shown in FIG. 5A, when a finger 7 is in contact with the fingerprint-recognizing surface of the semiconductor apparatus for fingerprint recognition, a capacitor is formed between the charge storage electrodes 21, the insulating protecting film 30 and the finger 7. The insulating protecting film 30 functions as a part of the capacitor insulating film. In the construction mentioned above, the distance d (for example, $d_1$, $d_2$) between the charge storage electrodes 21 and the finger 7 varies depending on fingerprint unevenness 70. Accordingly, a difference in capacity is caused between the capacitors which constitute the fingerprint sensor and which are formed to be arranged in a matrix form, and thus, the charge stored in each of the charge storage electrodes 21 is read and detected by the semiconductor device formed on the substrate 10, such as a transistor or the like, making it possible to recognize a fingerprint.

In the above semiconductor apparatus, each of the charge storage electrodes 21 constitutes a unit cell of the fingerprint-recognizing surface of the semiconductor device for fingerprint recognition.

In a state such that the finger is not in contact with the fingerprint-recognizing surface, the capacitors constituted by the charge storage electrodes 21 and the like have a d value which is infinite ($\infty$) in all of the unit cells of the fingerprint-recognizing surface of the semiconductor apparatus for fingerprint recognition. Therefore, in all of the unit cells, the electrostatic capacity value Cs is zero (0).

Figure 5B:
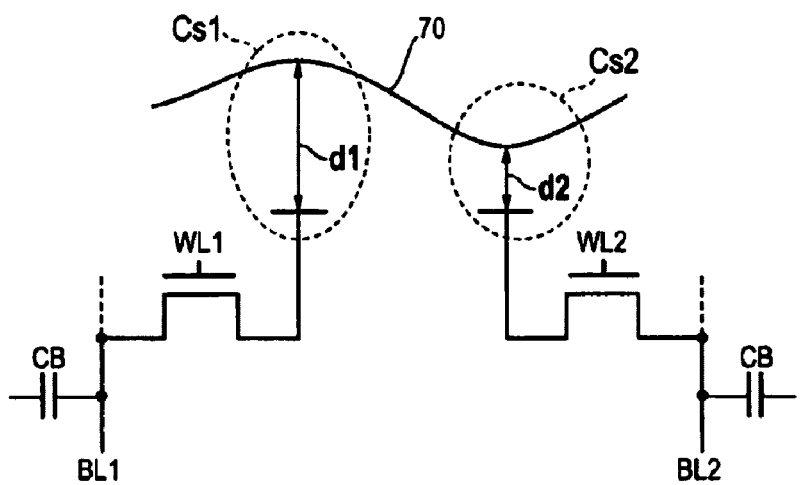

On the other hand, in a state such that the finger is in contact with the fingerprint-recognizing surface, as shown in FIG. 5B, in the n-th unit cell, a capacitor having an electrostatic capacity value $C_{sn}$ is formed between the charge storage electrodes 21, the insulating protecting film 30 and the finger 7. The electrostatic capacity value $C_{sn}$ is represented by the formula: $C_{sn} = \epsilon \cdot \epsilon_0 \cdot S/d_n$. In this formula, S is an area contributing to the capacitor of each electrode, $d_n$ is a distance (for example, $d_1$, $d_2$) between the electrode of the n-th unit cell and the finger, and n is the number (n=1, 2, ...) of the unit cell.

In the construction for reading the electrostatic capacity value $C_{sn}$ in each of the unit cells, the capacitor formed between the charge storage electrode 21 of each unit cell, the insulating protecting film 30 and the finger 7 is connected to one source-drain region of the transistor which is gate-controlled by, for example, a word line WL ($WL_1$, $WL_2$, ...), and another source-drain region is connected to a bit line BL ($BL_1$, $BL_2$, ...), and further, a capacitor having an electrostatic capacity value CB is connected to the bit line BL.

In the above construction, when a finger is in contact with the recognition surface in a state such that a potential $V_{cc}$ is applied to the bit line BL ($V_{cc}$ precharge), a potential change represented by the formula: $\Delta V_n = [C_{sn}/(CB+C_{sn})] \cdot V_{cc}$ is caused in the bit line BL. The potential change $\Delta V_n$ is detected in each of the unit cells, and the electrostatic capacity value $C_{sn}$ per unit cell is calculated, so that the fingerprint recognition is conducted by image processing or the like.

With respect to the semiconductor apparatus for fingerprint recognition which is operated as mentioned above, the first embodiment of the present invention is described with reference to FIG. 1.

FIG. 1 is a diagrammatic cross-sectional view of a semiconductor apparatus for fingerprint recognition according to the first embodiment of the present invention, which constitutes a capacitive mode fingerprint sensor.

In the present embodiment, a wiring 301 for drawing static electricity (hereinafter, frequently referred to as "static-electricity drawing wiring 301") having a thickness larger than that of an electrode 2 is formed along the line in the longitudinal direction of the electrode 2 (so that the lower surfaces of the wiring 301 and the electrode 2 are aligned in this example). The static-electricity drawing wiring 301 is formed electrically independently from the electrode 2.

Figure 4:
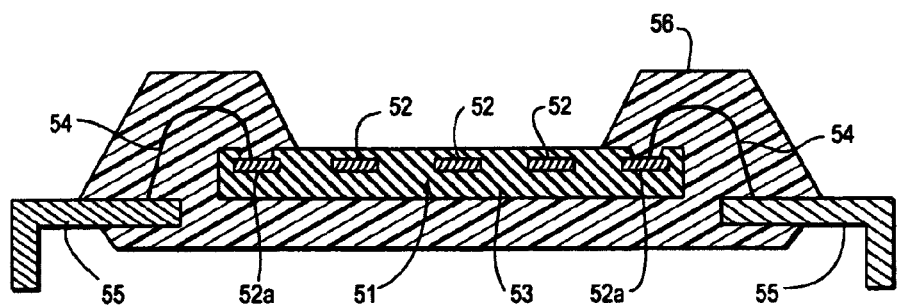
FIG. 4 is a diagrammatic cross-sectional view of one example of a conventional semiconductor apparatus for fingerprint recognition.

An insulating protecting film 3, such as a passivation film, is formed so as to cover the electrodes 2, the static-electricity drawing wiring 301 having a thickness larger than that of the electrode 2, and a pad electrodes 2a, and an opening portion is formed in the upper surface of the pad electrode 2a. Other portions in the present embodiment are the same as the corresponding portions in the prior art (FIG. 4).

The semiconductor device for fingerprint recognition of the present embodiment can be produced by, for example, the following method.

First, a semiconductor device, such as a transistor, which functions as a reading circuit, is formed on a semiconductor substrate, and then, aluminum or an aluminum alloy, such as aluminum silicide, is deposited on the semiconductor substrate by a sputtering process so as to have a thickness of about 1.5 μm.

Then, a resist film for the patterns of a static-electricity drawing wiring and at least one pad electrode is formed by patterning by means of a photolithography process, and subjected to etching, such as reactive ion etching (hereinafter, frequently referred to simply as "RIE"), so that a static-electricity drawing wiring comprised of aluminum or the like is formed so as to be disposed between electrodes which are formed by patterning in the subsequent step so that they are arranged in a matrix form. At the same time, at least one pad electrode is formed in a form such that it is connected to the static-electricity drawing wiring.

Next, a Ti layer or a stacked film, such as a Ti/TiN/Ti film, is deposited by, for example, a sputtering process so that it is connected to the above semiconductor device, and further, aluminum or an aluminum alloy, such as aluminum silicide, is deposited by a sputtering process so that the total thickness of the resultant film becomes about 0.5 μm.

Then, a resist film for the patterns of the above-mentioned static-electricity drawing wiring and at least one pad electrode, an electrode, and a pad electrode for taking a signal out or the like is formed by patterning by means of a photolithography process, and subjected to etching, such as RIE, to thereby effect patterning so that a stacked film comprised of a barrier metal layer, such as a Ti layer, aluminum and the like is left on the static-electricity drawing wiring and at least one pad electrode, and on the remaining region, the electrodes and the pad electrodes for taking a signal out or the like are arranged in a matrix form.

Next, an insulating film, such as a stacked film of silicon nitride or silicon oxide, is deposited by, for example, a chemical vapor deposition (hereinafter, referred to simply as "CVD") process so as to have a thickness of about 1 µm, to thereby form an insulating protecting film 3. An opening portion through which the pad electrode 2a is exposed to the outside is formed in the insulating protecting film 3 by patterning. Then, the resultant device is subjected to dicing treatment, to thereby form a fingerprint recognition semiconductor chip 1.

Subsequently, the pad electrode 2a and a lead 5 which is subjected to silver electroplating treatment or the like are connected to each other by a wire bonding 4 using, for example, a gold line or the like.

Then, while exposing the fingerprint-recognizing surface of the fingerprint recognition semiconductor chip to the outside, the semiconductor chip 1 and the wire bonding 4 are encapsulated by an encapsulation mold resin 6 comprised of, for example, a thermosetting resin.

In the semiconductor apparatus for fingerprint recognition produced by the above production steps, the static-electricity drawing wiring 301 having a thickness of about 2 µm has a structure such that it protrudes from the fingerprint-recognizing surface upwardly, as compared to the electrode 2 having a thickness of about 0.5 µm. Therefore, when a finger or any other material which is electrostatically charged is brought closer to the fingerprint-recognizing surface, the static electricity is not discharged into the electrode 2 but into the static-electricity drawing wiring 301. Since the static-electricity drawing wiring 301 is directly connected to electrode 2a as mentioned above, the current discharged is directly drawn out of the semiconductor apparatus for fingerprint recognition through the pad electrode 2a and the wire bonding 4. Therefore, the semiconductor devices and the circuits which are incorporated into the semiconductor device for fingerprint recognition suffer no damage.

Especially in the semiconductor apparatus for fingerprint recognition which recognizes a fingerprint by reading the charge stored in the electrode 2, the fingerprint-recognizing surface is exposed to the outside without being encapsulated by a resin. Therefore, not only is the fingerprint-recognizing surface exposed to a danger of an external static electricity, but also a finger is inevitably directly in contact with the fingerprint-recognizing surface for achieving the function as a fingerprint recognition device. However, by employing in the fingerprint recognition device the structure formed by the above-mentioned production steps, the discharged current of the static electricity can be prevented from flowing into the internal circuit of the semiconductor apparatus for fingerprint recognition, thus making it possible to prevent a damage of the function of the device due to the static electricity.

Figure 2:
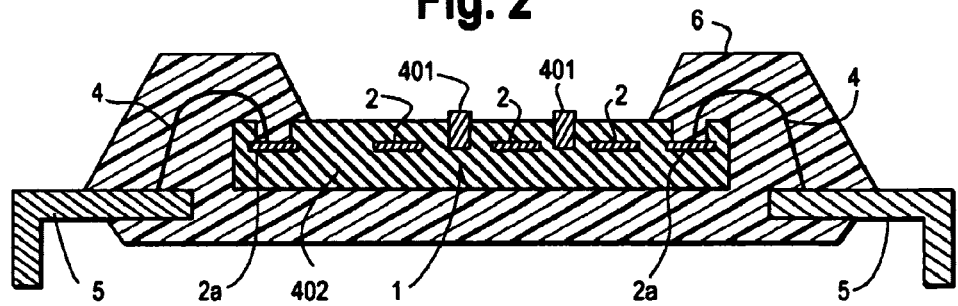
FIG. 2 is a diagrammatic cross-sectional view of a semiconductor apparatus for fingerprint recognition according to the second embodiment of the present invention.

Next, the second embodiment of the present invention is described with reference to FIG. 2.

The function as a semiconductor device for fingerprint recognition of the second embodiment is the same as that of the above-mentioned first embodiment, and therefore, only the wiring for drawing static electricity, which is a characteristic feature of the present invention, is described below.

In the present embodiment, a wiring 401 for drawing static electricity (hereinafter, frequently referred to as "static-electricity drawing wiring 401") having a thickness larger than that of an electrode 2 is formed along the line in the longitudinal direction of the electrode 2 (so that the lower surfaces of the wire 401 and the electrode 2 are aligned in this example). The static-electricity drawing wiring 401 is formed electrically independently from the electrode 2.

An insulating protecting film 402, such as a passivation film, is formed so as to cover both of the electrode 2 and a pad electrode 2a, and an opening portion is formed in the upper surface of the pad electrode 2a. In this instance, the thickness of the insulating protecting film 402, such as a passivation film, which is on the side of the upper surface of the electrode 2 is equivalent to the difference in thickness between the electrode 2 and the static-electricity drawing wiring 401 having a thickness larger than that of the electrode 2. That is, the upper surface of the static-electricity drawing wiring 401 having a thickness larger than that of the electrode 2 is exposed to the outside through the surface of the insulating protecting film 402. Other portions in the present embodiment are the same as the corresponding portions in the first embodiment of the present invention (FIG. 1).

The semiconductor apparatus for fingerprint recognition of the present embodiment can be produced by, for example, the following method.

First, a semiconductor device, such as a transistor, which functions as a reading circuit, is formed on a semiconductor substrate, and then, aluminum or an aluminum alloy, such as aluminum silicide, is deposited on the semiconductor substrate by a sputtering process so as to have a thickness of about 1.5 µm.

Then, a resist film for the patterns of a static-electricity drawing wiring and at least one pad electrode is formed by patterning by means of a photolithography process, and subjected to etching, such as RIE, so that a static-electricity drawing wiring comprised of aluminum or the like is formed so as to be disposed between electrodes which are formed by patterning in the subsequent step so that they are arranged in a matrix form. At the same time, at least one pad electrode is formed in a form such that it is connected to the static-electricity drawing wiring.

Next, a Ti layer or a stacked film, such as a Ti/TiN/Ti film, is deposited by, for example, a sputtering process so such that it is connected to the above semiconductor device, and further, aluminum or an aluminum alloy, such as aluminum silicide, is deposited by a sputtering process so that the total thickness of the resultant film becomes about 0.5 µm.

Then, a resist film for the patterns of the above-mentioned static-electricity drawing wiring and at least one pad electrode, an electrode, and a pad electrode for taking a signal out or the like is formed by patterning by means of a photolithography process, and subjected to etching, such as RIE, to thereby effect patterning so that a stacked film comprised of a barrier metal layer, such as a Ti layer, aluminum and the like is left on the static-electricity drawing wiring and at least one pad electrode, and on the remaining region, the electrode and the pad electrode for taking a signal out or the like are arranged in a matrix form.

Next, an insulating film, such as a stacked film of silicon nitride or silicon oxide, is deposited by, for example, a CVD process so as to have a thickness of about 3 µm, and the surface of the resultant insulating film is polished by a chemical mechanical polishing (hereinafter, referred to simply as "CMP") process until the above-mentioned static-electricity drawing wiring is exposed to the outside, to thereby form an insulating protecting film 402. Then, an opening portion through which the pad electrode 2a is exposed to the outside is formed in the insulating protecting film 402 by patterning. The subsequent steps for production in the present embodiment are the same as the corresponding steps in the first embodiment of the present invention.

In the semiconductor apparatus for fingerprint recognition of the second embodiment, the static-electricity drawing wiring having a thickness of about 2 μm has a structure such that it protrudes from the fingerprint-recognizing surface upwardly, as compared to the electrode having a thickness of about 0.5 μm, and, in addition, the static-electricity drawing wiring is exposed to the outside through the surface of the semiconductor apparatus for fingerprint recognition. Therefore, when a finger or any other material which is electrostatically charged is brought closer to the fingerprint-recognizing surface, the static electricity is not discharged into the electrode but into the static-electricity drawing wiring. (The effect of drawing static electricity in the second embodiment is larger than that in the first embodiment by a magnitude corresponding to the fact that the static-electricity drawing wiring is exposed to the outside through the surface of the semiconductor apparatus for fingerprint recognition.)

Since the static-electricity drawing wiring 401 is directly connected to the pad electrode 2a as mentioned above, the current discharged is directly drawn out of the semiconductor apparatus for fingerprint recognition through the pad electrode 2a and the wire bonding 4. Therefore, the semiconductor devices and the circuits which are incorporated into the semiconductor apparatus for fingerprint recognition suffer no damage.

Further, from the viewpoint of facilitating the recognition of a fingerprint, it is desired that a finger is in a ground potential. When a finger is in contact with the fingerprint-recognizing surface of the semiconductor apparatus for fingerprint recognition, the finger is also in contact with the static-electricity drawing wiring at the same time. Therefore, by making the static-electricity drawing wiring be in a ground potential, it is possible to surely render the finger be in a ground potential.

Figure 3:
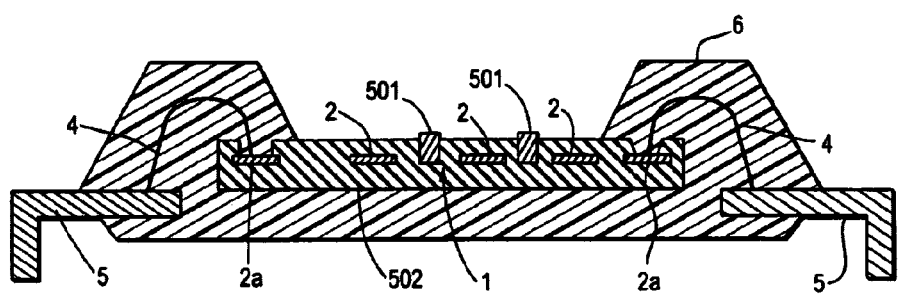
FIG. 3 is diagrammatic cross-sectional view of a semiconductor apparatus for fingerprint recognition according to the third embodiment of the present invention.

Next, the third embodiment of the present invention is described with reference to FIG. 3.

The function as a semiconductor apparatus for fingerprint recognition of the third embodiment is the same as that of the above-mentioned first embodiment, and therefore, only the wiring for drawing static electricity, which is a characteristic feature of the present invention, is described below.

In the present embodiment, a wiring 501 for drawing static electricity (hereinafter, frequently referred to as "static-electricity drawing wiring 501") having a thickness larger than that of an electrode 2 is formed along the line in the longitudinal direction of the electrode 2 (so that the lower surfaces of the wiring 501 and the electrode 2 are aligned in this example). The static-electricity drawing wiring 501 is formed electrically independently from the electrode 2.

An insulating protecting film 502, such as a passivation film, is formed so as to cover both of the electrode 2 and a pad electrode 2a, and an opening portion is formed in the upper surface of the pad electrode 2a. In the present embodiment, the upper portion of the static-electricity drawing wiring 501 having a thickness larger than that of the electrode 2 protrudes from the surface of the insulating protecting film 502. Other portions in the present embodiment are the same as the corresponding portions in the second embodiment of the present invention (FIG. 2).

The semiconductor apparatus for fingerprint recognition of the present embodiment can be produced by, for example, the following method.

First, a semiconductor device, such as a transistor, which functions as a reading circuit, is formed on a semiconductor substrate, and then, aluminum or an aluminum alloy, such as aluminum silicide, is deposited on the semiconductor substrate by a sputtering process so as to have a thickness of about 1.5 μm.

Then, a resist film for the patterns of a static-electricity drawing wiring and at least one pad electrode is formed by patterning by means of a photolithography process, and subjected to etching, such as RIE, so that a static-electricity drawing wiring comprised of aluminum or the like is formed so as to be disposed between electrodes which are formed by patterning in the subsequent step so that they are arranged in a matrix form. At the same time, at least one pad electrode is formed in a form such that it is connected to the static-electricity drawing wiring.

Next, a Ti layer or a stacked film, such as a Ti/TiN/Ti film, is deposited by, for example, a sputtering process so such that it is connected to the above semiconductor device, and further, aluminum or an aluminum alloy, such as aluminum silicide, is deposited by a sputtering process so that the total thickness of the resultant film becomes about 0.5 am.

Then, a resist film for the patterns of the above-mentioned static-electricity drawing wiring and at least one pad electrode, an electrode, and a pad electrode for taking a signal out or the like is formed by patterning by means of a photolithography process, and subjected to etching, such as RIE, to thereby effect patterning so that a stacked film comprised of a barrier metal layer, such as a Ti layer, aluminum and the like is left on the static-electricity drawing wiring and at least one pad electrode, and on the remaining region, the electrode and the pad electrode for taking a signal out or the like are arranged in a matrix form.

Next, an insulating film, such as a stacked film of silicon nitride or silicon oxide, is deposited by, for example, a CVD process so as to have a thickness of about 3 μm, and the surface of the resultant insulating film is polished by a CMP process until the above-mentioned static-electricity drawing wiring is exposed to the outside, to thereby form an insulating protecting film 502. Then, an opening portion through which the pad electrode 2a is exposed to the outside is formed in the insulating protecting film 502 by patterning. The steps up to now in the present embodiment are the same as the corresponding steps in the second embodiment of the present invention.

Then, the upper surface of the insulating protecting film 502 is thoroughly subjected to etching by, for example, an RIE technique so that the about 0.5 μm-thick insulating protecting film from the upper surface thereof is etched. Thus, the thickness of the resultant insulating protecting film is smaller than that of the insulating protecting film shown in FIG. 2 by about 0.5 μm, and therefore, the upper portion of the static-electricity drawing wiring 501 protrudes from the insulating protecting film 502 by about 0.5 μm which corresponds to the thickness of the etched film. The subsequent steps for production in the present embodiment are the same as the corresponding steps in the first embodiment of the present invention.

The semiconductor apparatus for fingerprint recognition of the third embodiment has a structure such that the static-electricity drawing wiring 501 is exposed to the outside and protrudes upwardly from the fingerprint-recognizing surface. Therefore, when a finger or any other material which is electrostatically charged is brought closer, to the fingerprint-recognizing surface, the static electricity is not discharged into the electrode 2 but surely into the static-electricity drawing wiring 501. Thus, the static electricity discharged does not cause the semiconductor devices and the circuits which are incorporated into the semiconductor apparatus for fingerprint recognition to be damaged.

Further, as mentioned above, the semiconductor apparatus for fingerprint recognition has a structure such that the static-electricity drawing wiring 501 is exposed to the outside and protrudes upwardly from the fingerprint-recognizing surface. Therefore, by making the static-electricity drawing wiring be in a ground potential, a finger in contact with the fingerprint-recognizing surface is surely in contact with the static-electricity drawing wiring and made be in a ground potential, thus rendering it possible to stably and surely perform the fingerprint recognition.

By virtue of having a unique structure such that the static-electricity drawing wiring protrudes upwardly from the electrode on the substrate, the semiconductor apparatus of the present invention is advantageous in that, when a finger or any other material which is electrostatically charged is brought closer to the substrate, the static electricity is not discharged into the electrode but into the static-electricity drawing wiring and then drawn out of the semiconductor apparatus, so that the semiconductor devices, the circuits and the like which are connected to the electrode can be prevented from suffering a damage due to the static electricity and from losing the functions thereof.

Especially in the semiconductor apparatus for fingerprint recognition of the present invention, when a finger which is electrostatically charged is brought closer to the fingerprint-recognizing surface, by virtue of having the above unique structure, the static electricity is not discharged into the electrode but into the static-electricity drawing wiring and then drawn out of the semiconductor apparatus, so that the semiconductor devices, the circuits and the like which are connected to the electrode can be prevented from suffering a damage due to the static electricity and from losing the functions thereof.

What is claimed is:

1. A semiconductor apparatus, comprising:
    a substrate having a transistor formed thereon;
    a plurality of first capacitor electrodes secured to said substrate and;
    a plurality of second electrodes secured to said substrate and electrically separated from said first electrodes; and
    an insulating film formed so as to cover said first electrodes and which is between the first electrodes and second electrodes,
    wherein the first and second electrodes have a common bottom level and the plurality of second electrodes each have a top surface which is above a top surface of the first electrodes;
    wherein the second electrodes have insulation over the top surface thereof that a distance between a top surface of said substrate and said insulation over the top surface of the second electrodes is larger than a distance between the top surface of said substrate and the uppermost surface of said insulating film formed over the first electrodes.

* * * * *